US009069336B2

(12) United States Patent
Kim et al.

(10) Patent No.: US 9,069,336 B2
(45) Date of Patent: Jun. 30, 2015

(54) ULTRA-PRECISION POSITION CONTROL DEVICE AND METHOD FOR DETERMINING POSITION AND ATTITUDE INFORMATION ASSOCIATED WITH A 6-DEGREE-OF-FREEDOM STAGE THEREOF (75) Inventors: Ja Yul Kim, Seoul (KR); Sang Don Jang, Suwon-si (KR); Tae Kyu Son, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 408 days.

(21) Appl. No.: 13/585,295

(22) Filed: Aug. 14, 2012

(65) Prior Publication Data

US 2013/0218304 A1  Aug. 22, 2013

(30) Foreign Application Priority Data

Aug. 16, 2011  (KR) .................. 10-2011-0081351

(51) Int. Cl.
*G05B 11/01* (2006.01)
*G03F 7/20* (2006.01)

(52) U.S. Cl.
CPC ............ *G05B 11/01* (2013.01); *G03F 7/70725* (2013.01); *G03F 7/70775* (2013.01)

(58) Field of Classification Search
CPC .. G05B 11/01; G03F 7/70725; G03F 7/70775
USPC ......................................... 700/56, 60, 67, 69
See application file for complete search history.

(56) References Cited

U.S. PATENT DOCUMENTS

| 6,355,994 | B1 * | 3/2002 | Andeen et al. ................. 310/15 |
| 6,471,435 | B1 * | 10/2002 | Lee ............................ 403/220 |
| 6,522,388 | B1 * | 2/2003 | Takahashi et al. ............ 355/53 |
| 6,867,534 | B2 * | 3/2005 | Tanaka ....................... 310/328 |
| 6,872,958 | B2 * | 3/2005 | Andeen et al. ............. 250/492.2 |
| 6,940,582 | B1 * | 9/2005 | Tanaka ....................... 355/53 |
| 6,953,109 | B2 * | 10/2005 | Watson et al. ............... 188/378 |
| 8,013,982 | B2 * | 9/2011 | Shibazaki .................... 355/72 |
| 2002/0127050 | A1 * | 9/2002 | Andeen et al. ............... 403/220 |

* cited by examiner

*Primary Examiner* — Charles Kasenge
(74) *Attorney, Agent, or Firm* — H.C. Park & Associates, PLC (57) ABSTRACT

A method of determining and controlling position and attitude information associated with a 6-degree-of-freedom stage includes: receiving, from a plurality of sensors associated with the 6-degree-of-freedom stage, displacement information associated with the 6-degree-of-freedom stage. A plurality of equations associated with the plurality of sensors are determined by a control unit based on the displacement information to represent an amount of change in position and attitude associated with each measurement axis of each of the plurality of sensors. The control unit determines position information and attitude information associated with the 6-degree-of-freedom stage using the equations. Movement of the 6-degree-of-freedom stage is caused, at least in part, to be controlled based on the position information, the attitude information, or both the position information and the attitude information. Three coordinate values associated with each valid measurement point of each of the plurality of sensors are associated with at least one degree of freedom.

11 Claims, 6 Drawing Sheets

ULTRA-PRECISION POSITION CONTROL DEVICE AND METHOD FOR DETERMINING POSITION AND ATTITUDE INFORMATION ASSOCIATED WITH A 6-DEGREE-OF-FREEDOM STAGE THEREOF

CROSS-REFERENCE TO RELATED APPLICATION

This application claims priority from and the benefit of Korean Patent Application No. 10-2011-0081351, filed on Aug. 16, 2011, which is hereby incorporated by reference for all purposes as if fully set forth herein.

BACKGROUND

1. Field

Embodiments of the present disclosure relate to calculating position and attitude information associated with a 6-degree-of-freedom stage, and more particularly to calculating position and attitude information associated with a 6-degree-of-freedom stage based on kinematics and displacement and/or movement information received from one or more sensors.

2. Discussion

Importance of ultra-precision position control technology has persistently increased in industries. Particularly, semiconductor technology has been improved due to the demand for higher integration of circuits, such that recent microprocessors have been manufactured including minimum line widths of about 0.18 μm. A stage used to manufacture wafers associated with these microprocessors generally require tolerances of about 1/10 of such line widths and, thereby, typically requiring reproducibility of about 20 nm.

Many technologies may be needed to achieve such small line widths. One important aspect of such technologies is accurate stage control. If stage position control is not accurate, such small widths may not be achieved even when other technologies are applied.

Accordingly, many semiconductor exposure and inspection devices employ a 6-degree-of-freedom stage whose attitude may be accurately and quickly controlled. However, the 6-degree-of-freedom stage may need to float in the air without a guide since each of the degrees of freedom of the stage may need to be controlled. Therefore, it may be difficult to control the position and attitude of the 6-degree-of-freedom stage and it may also be difficult to perform control tuning of the same.

Figure 1:
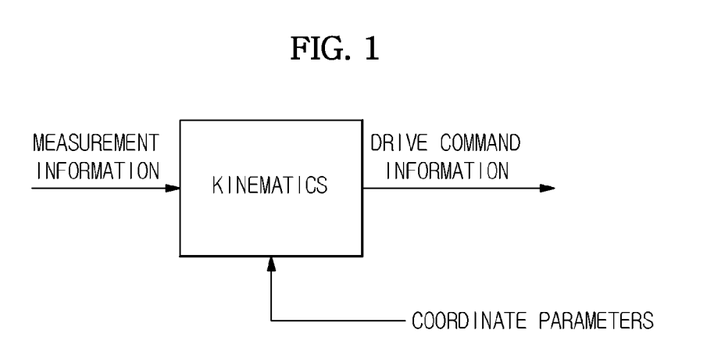
FIG. 1 is a block diagram of a kinematic control system used in association with ultra-precision position control technology.

FIG. 1 is a block diagram of a kinematic control system used in association with ultra-precision position control technology.

As shown in FIG. 1, the kinematic control system serves to convert measurement information received from one or more sensors into drive command information that is to be delivered to, for instance, an actuator in order to control the stage so as to have a desired position (coordinates) and/or a desired attitude (angle). Kinematic control systems employing one or more kinematic control techniques may be needed since the measurement position and the drive position of the stage may physically differ.

In this manner, various procedures to obtain solutions to rather complex, burdensome equations may be needed to implement such kinematic control systems. Since such equations associated with 6-degree-of-freedom stages are so complicated, 1) a scheme that uses mathematical simplification or 2) a scheme that uses a plurality of kinematic solutions may be employed for the 6-degree-of-freedom stage.

Both schemes involve an approximation process, which can reduce the accuracy of such kinematic control systems.

Reduction in the accuracy of a kinematic control system greatly affects the accuracy of coordinate parameters, thereby making control tuning difficult. Here, the coordinate parameters indicate coordinates of a valid measurement point of a sensor, coordinates of a mounting position of an actuator, coordinates of a virtual rotation center, and/or the like.

Kinematic control systems that utilize approximation processes may be satisfactorily applied to a certain extent when, for example, rotation angles Tx, Ty, and Tz of the stage are small or negligible. However, as the rotation angle of the stage increases, the rate of error of such approximated kinematic control systems increases proportionally with the rotation angle. Accordingly, such approximated kinematic solutions may not be applied to a stage whose rotational stroke is great.

The above information disclosed in this Background section is only for enhancement of understanding of the background of the invention and therefore it may contain information that does not form any part of the prior art nor what the prior art may suggest to a person of ordinary skill in the art.

SUMMARY

Various exemplary embodiments provide an apparatus and method to more accurately determine and control position and attitude information associated with a 6-degree-of-freedom stage, without approximation in kinematics, and an apparatus and method to more accurately model a 6-degree-of-freedom stage without approximation in kinematics.

Additional aspects of the invention will be set forth in the description which follows and, in part, will be apparent from the description, or may be learned by practice of the invention.

According to one exemplary embodiment, a method includes: receiving, from a plurality of sensors associated with a 6-degree-of-freedom stage, displacement information associated with movement of the 6-degree-of-freedom stage; determining, by a control unit and based on the displacement information, a plurality of equations associated with the plurality of sensors to represent an amount of change in position and attitude associated with each measurement axis of each of the plurality of sensors; determining, by the control unit, position information (X, Y, Z) and attitude information (Tx, Ty, Tz) associated with the 6-degree-of-freedom stage using the equations; and causing, at least in part, the movement of the 6-degree-of-freedom stage to be controlled based on the position information (X, Y, Z), the attitude information (Tx, Ty, Tz), or both the position information (X, Y, Z) and the attitude information (Tx, Ty, Tz), wherein three coordinate values associated with each valid measurement point of each of the plurality of sensors are associated with at least one degree of freedom.

According to another exemplary embodiment, an ultra-precision position control device includes: a 6-degree-of-freedom stage; a plurality of sensors configured to measure displacement information associated with movement of the 6-degree-of-freedom stage; a controller configured to: receive displacement information associated with the 6-degree-of-freedom stage from the plurality of sensors, determine, based on the displacement information, a plurality of equations associated with the plurality of sensors to represent an amount of change in position and attitude associated with each measurement axis of each of the plurality of sensors, determine position information (X, Y, Z) and attitude information (Tx, Ty, Tz) associated with the 6-degree-of-freedom stage using the equations, and generate at least one drive command signal using the position information (X, Y, Z) and the attitude information (Tx, Ty, Tz) associated with the 6-degree-of-freedom stage; and a drive unit configured to receive the at least one drive command signal and to drive the 6-degree-of-freedom stage in one or more translational or rotational motions based on the at least one drive command signal, wherein three coordinate values associated with each valid measurement point of each of the plurality of sensors are associated with at least one degree of freedom.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers and/or regions may be exaggerated for clarity and descriptive purposes. Also, like reference numerals denote like elements.

When an element or layer is referred to as being "on" or "connected to" another element or layer, it may be directly on or directly connected to the other element or layer, or intervening elements or layers may be present. When, however, an element is referred to as being "directly on" or "directly connected to" another element or layer, there are no intervening elements or layers present. For the purposes of this disclosure, "at least one of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by the use of these terms. These terms are only used to distinguish one element, component, region, layer or section from another element, component, region, layer or section. Thus, a first element, component, region, layer or section that is discussed below could be termed a second, third, etc., element, component, region, layer or section without departing from the teachings of the present invention.

Spatially relative terms, such as "beneath", "below", "lower", "above", "upper" and the like, may be used herein for descriptive purposes and, thereby, to describe one element or feature's relationship to another element(s) or feature(s) as illustrated in the drawings. It will be understood that spatially relative terms are intended to encompass different orientations of an apparatus in use and/or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations) and, as such, the spatially relative descriptors used herein are to be interpreted accordingly.

The terminology used herein is for the purpose of describing particular embodiments only and is not intended to be limiting. As used herein, the singular forms "a", "an" and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense unless expressly defined as such herein.

Figure 2:
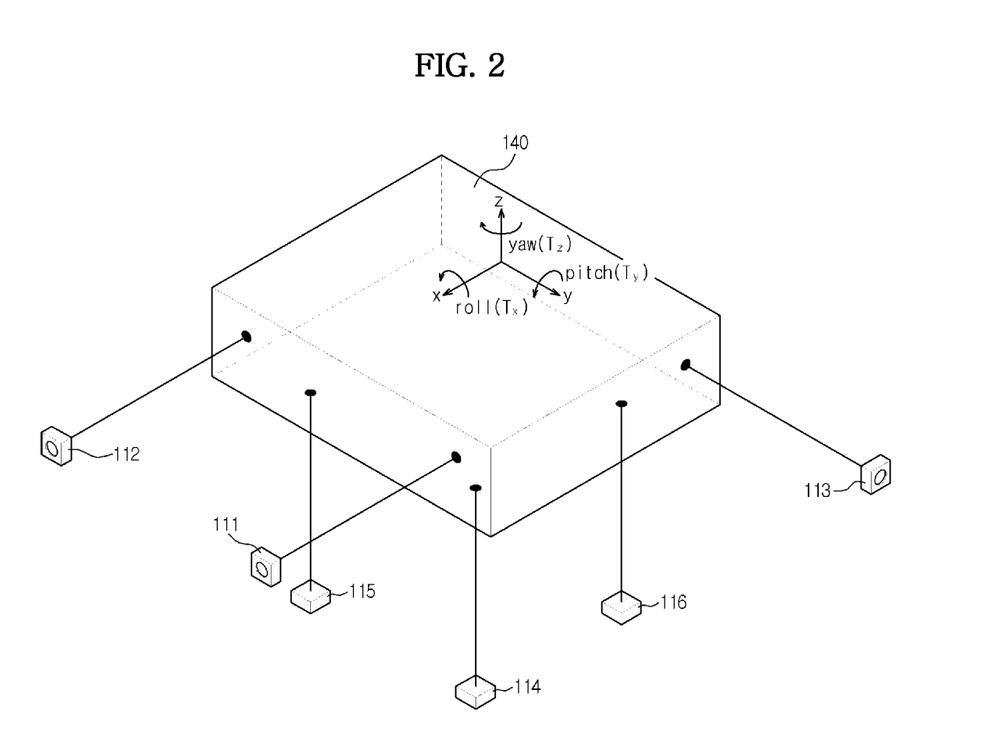
FIG. 2 is an external configuration of an ultra-precision position control device, according to an exemplary embodiment.

FIG. 2 is an external configuration of an ultra-precision position control device, according to an exemplary embodiment.

As shown in FIG. 2, the ultra-precision position control device (or device) 100 includes a 6-degree-of-freedom stage 140, which may be movable in an x direction, a y direction, a z direction, a roll direction (which is a direction of rotation about an x axis), a pitch direction (which is a direction of rotation about a y axis), and a yaw direction (which is a direction of rotation about a z axis), as well as in directions constituting one or more combinations thereof. It is further noted that device 100 includes a plurality of sensors, e.g., six sensors, such as sensors 111-116, that are provided on (or otherwise associated with) the 6-degree-of-freedom stage 140. Sensors 111-116 are configured to acquire displacement and/or movement information (hereinafter referred to as displacement information) associated with the 6-degree-of-freedom stage 140. According to various exemplary embodiments, sensors 111-116 may include one or more laser interferometers, gap sensors, proximity sensors, etc. As such, sensors 111-116 may be configured to measure (or otherwise detect) displacement information associated with the 6-degree-of-freedom stage 140. It is contemplated, however, that the plurality of sensors may include one or more additional and/or alternative sensors configured to determine (or detect) force, moment, posture, etc. information, which may be utilized to determine the aforementioned displacement information. In this manner, any suitable sensor may be utilized.

Figure 3:
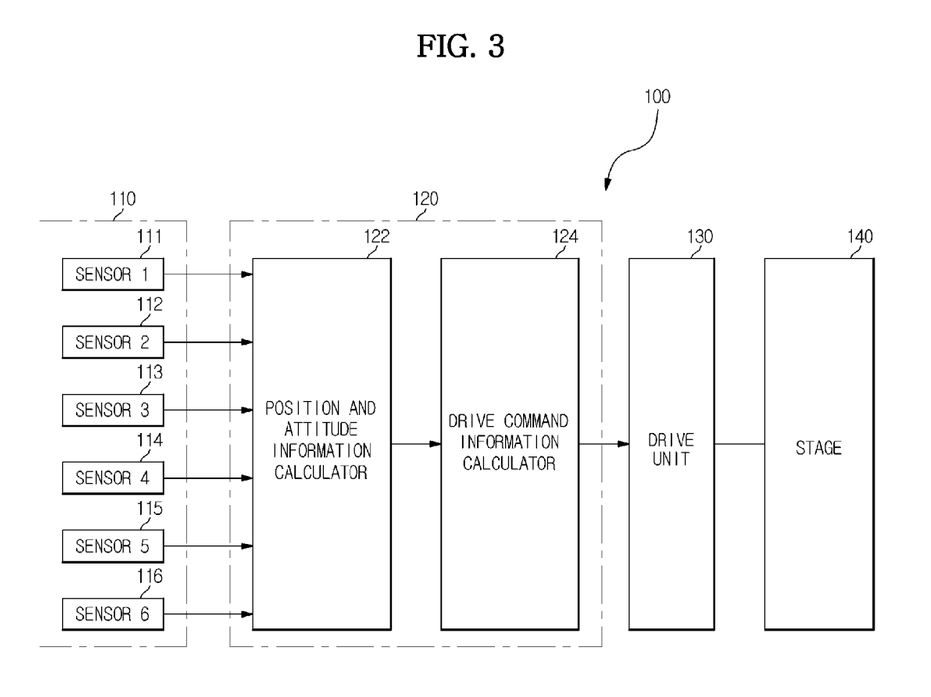
FIG. 3 is a block diagram of a kinematic control system associated with the ultra-precision position control device of FIG. 2, according to an exemplary embodiment.

FIG. 3 is a block diagram of a kinematic control system associated with the ultra-precision position control device of FIG. 2, according to an exemplary embodiment.

As shown in FIG. 3, the ultra-precision position control device 100 includes (or is associated with) a controller 120 and a drive unit 130, in addition to the various components shown in FIG. 2.

A measurement unit 110 is a measurement (or detection) device that acquires (or determines) displacement information associated with the 6-degree-of-freedom stage 140 and includes a plurality of sensors, such as 6 sensors, e.g., sensors 111-116. The measurement unit 110 is configured to determine position and attitude information associated with the stage 140. In one exemplary embodiment, a laser interferometer may be used as at least one of sensors 111-116 to measure displacement information associated with the 6-degree-of-freedom stage 140. As previously mentioned; however, it is contemplated that any other device, such as a gap sensor, may also (or alternatively) be used, provided that the device is able to acquire (or otherwise determine) displacement information associated with the stage 140.

The controller 120 controls overall operation of the ultra-precision position control device 100 and includes a position and attitude information module 122 and a drive command information module 124.

The position and attitude information module (or module) 122 is configured to convert displacement information associated with the stage 140, which is, for example, measured via sensors 111-116, into position information (X, Y, Z) and attitude information (Tx, Ty, Tz) based on one or more sensor kinematic expressions. Module 122 is further configured to output the position information and the attitude information to the drive command information module (or module) 124.

The drive command information module 124 is configured to convert the position information (X, Y, Z) and attitude information (Tx, Ty, Tz) associated with the stage 140 acquired through conversion by the position and attitude information module 122 into drive (or control) command information through one or more actuator kinematics. Module 124 is further configured to output the drive command information to the drive unit 130.

The drive unit 130 is configured to drive (or otherwise manipulate) the stage 140 to translate or rotate the stage (or one or more components thereof) according to the drive command information received from the drive command information module 124. According to one exemplary embodiment, one or more piezoelectric actuators may be used as the drive unit 130. It is contemplated; however, that drive unit 130 may include any number of suitable actuators and/or manipulators, such as one or more belt drives, comb drives, electroactive polymers, hydraulic mechanisms, motors, pistons, pneumatic mechanisms, relays, step motors, thermal bimorphs, etc.

Figure 4:
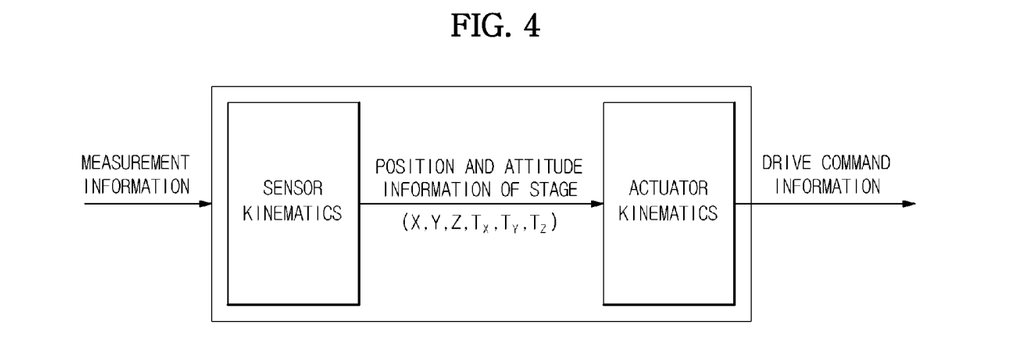
FIG. 4 is a process to determine kinematic control information associated with ultra-precision position control technology.

FIG. 4 is a process to determine kinematic control information associated with ultra-precision position control technology.

As shown in FIG. 4, values measured via a plurality of sensors are converted into position information (X, Y, Z) and attitude information (Tx, Ty, Tz) of a stage through sensor kinematics, such that the converted position information (X, Y, Z) and attitude information (Tx, Ty, Tz) of the stage may be converted into at least one drive command value to be transmitted to at least one actuator through actuator kinematics.

Application of the actuator kinematics does not cause problems associated with approximation since the actuator kinematics do not employ any mathematical inverse procedures. On the other hand, because the sensor kinematics employ approximation in a process of obtaining a solution (e.g., the position and attitude information (X, Y, Z, Tx, Ty, Tz) of the stage) through at least one mathematical inverse procedure, problems occur. Accordingly, when a term "kinematics" is used in the present invention, it is assumed that the term "kinematics" refers to sensor kinematics.

Figure 5:
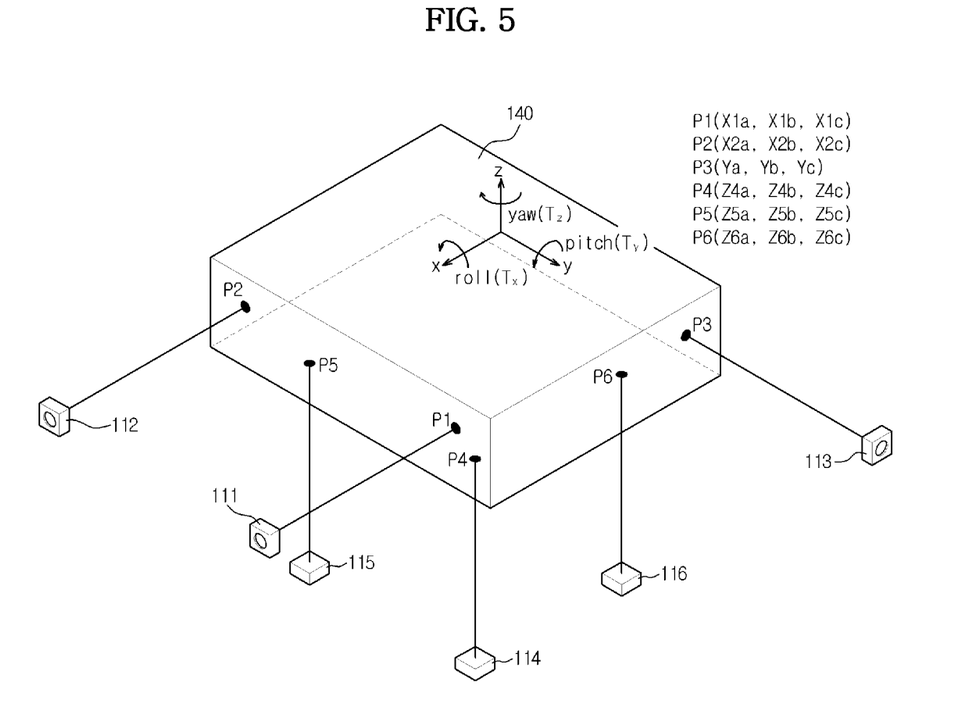
FIG. 5 is a modeled 6-degree-of-freedom stage for use in association with ultra-precision position control technology, according to an exemplary embodiment.

FIG. 5 is a modeled 6-degree-of-freedom stage for use in association with ultra-precision position control technology, according to an exemplary embodiment.

A laser interferometer, a gap sensor, or the like may be used for the measurement unit 110 to measure displacement information of the 6-degrees-of-freedom stage 140. A measurement location may be a point or a surface according to the characteristics of the sensor that measures the displacement information. However, the measurement location may be modeled as one point according to operation characteristics of the sensor. As such, these points may be defined as valid measurement points.

It is generally noted that stage 140 may be modeled in various manners and, therefore, without losing generality, the 6-degree-of-freedom stage 140 may be modeled using a generalized method, such as shown in FIG. 5. Sensors 111-116 are disposed in association with the 6-degree-of-freedom stage 140 to measure displacement information associated with the 6-degree-of-freedom stage 140. While it is contemplated that any suitable sensor may be utilized, the following description is provided in terms of sensors 111-116 corresponding to laser interferometers that are configured to measure the displacement information associated with the 6-degree-of-freedom stage 140 as an illustrative example.

According to one exemplary embodiment, the first sensor 111 and the second sensor 112 are arranged such that laser beams emitted from the first sensor 111 and the second sensor 112 are parallel to the x axis. The third sensor 113 is arranged such that a laser beam emitted from the third sensor 113 is parallel to the y axis. Further, the fourth sensor 114, the fifth sensor 115, and the sixth sensor 116 are arranged such that laser beams emitted from the fourth sensor 114, the fifth sensor 115, and the sixth sensor 116 are parallel to the z axis. Accordingly, the values shown at a right portion of FIG. 5 indicate coordinates of valid measurement points P1 to P6 of the sensors 111-116 disposed in association with the 6-degree-of-freedom stage 140. For example, a point at which a laser beam emitted from the first sensor 111 is reflected from a measurement surface of the 6-degree-of-freedom stage 140 is the valid measurement point, then P1 equates to (X1a, X1b, X1c) of the first sensor 111.

In this manner, one degree of freedom is assigned to all three coordinates of each of the 6 valid measurement points P1 to P6 so as not to lose generality of the 6-degree-of-freedom stage 140. Accordingly, a three-dimensional coordinate system whose origin is at the attitude center (rotation center) of the 6-degree-of-freedom stage 140 is defined, and a rotation angle Tx in the roll direction, a rotation angle Ty in the pitch direction, and a rotation angle Tz in the yaw direction are also defined, as shown in FIG. 5.

According to various exemplary embodiments, a matrix of rotation about the x axis, a matrix of rotation about the y axis, and a matrix of rotation about the z axis may be defined in a homogeneous transformation matrix (HTM) format as follows:

$$R_x = \begin{bmatrix} 1 & 0 & 0 & 0 \\ 0 & \cos(T_x) & -\sin(T_x) & 0 \\ 0 & \sin(T_x) & \cos(T_x) & 0 \\ 0 & 0 & 0 & 1 \end{bmatrix}$$

$$R_y = \begin{bmatrix} \cos(T_y) & 0 & \sin(T_y) & 0 \\ 0 & 1 & 0 & 0 \\ -\sin(T_y) & 0 & \cos(T_y) & 0 \\ 0 & 0 & 0 & 1 \end{bmatrix}$$

$$R_z = \begin{bmatrix} \cos(T_z) & -\sin(T_z) & 0 & 0 \\ \sin(T_z) & \cos(T_z) & 0 & 0 \\ 0 & 0 & 1 & 0 \\ 0 & 0 & 0 & 1 \end{bmatrix}$$

A translation matrix may also be defined in the HTM format as follows:

$$T = \begin{bmatrix} 1 & 0 & 0 & X \\ 0 & 1 & 0 & Y \\ 0 & 0 & 1 & Z \\ 0 & 0 & 0 & 1 \end{bmatrix}$$

When a figure obtained by rotating a figure f(x, y, z)=0 by Tx about the x axis is represented by f'(x', y', z')=0, a point (x, y, z) on f(x, y, z)=0 and a point (x', y', z') on f(x', y', z')=0 satisfy the following relationship:

$$\begin{bmatrix} x' \\ y' \\ z' \\ 1 \end{bmatrix} = Rx \times \begin{bmatrix} x \\ y \\ z \\ 1 \end{bmatrix}$$

It is noted that the same relationship may be applied to rotations about each of the other respective axes (i.e., the y and z axes).

When a figure obtained by translating a figure f(x, y, z)=0 by x, y, and z is represented by f'(x', y', z')=0, a point (x, y, z) on f(x, y, z)=0 and a point (x', y', z') on f(x', y', z')=0 satisfy the following relationship:

$$\begin{bmatrix} x' \\ y' \\ z' \\ 1 \end{bmatrix} = T \times \begin{bmatrix} x \\ y \\ z \\ 1 \end{bmatrix}$$

When a plane obtained by rotating px+qy+rz+s=0 by Tz about the z axis is represented by p'x'+q'y'+r'z'+s'=0, the following relationship is satisfied:

$$0 = [p \quad q \quad r \quad s] \times \begin{bmatrix} x \\ y \\ z \\ 1 \end{bmatrix}$$

$$= [p \quad q \quad r \quad s] \times Rz^{-1} \times \begin{bmatrix} x' \\ y' \\ z' \\ 1 \end{bmatrix}$$

$$= [p' \quad q' \quad r' \quad s'] \times \begin{bmatrix} x' \\ y' \\ z' \\ 1 \end{bmatrix}$$

$$= 0$$

$$\therefore [p' \quad q' \quad r' \quad s'] = [p \quad q \quad r \quad s] \times Rz^{-1}$$

Accordingly, an intersection point between the measurement plane and a measurement axis parallel to the x axis in the equation p'x'+q'y'+r'z'+s'=0 representing the rotated plane may be represented as follows:

$$x = -(q'y + r'z + s')/p' = -[p' \quad q' \quad r' \quad s'] \times \begin{bmatrix} 0 \\ y \\ z \\ 1 \end{bmatrix} / p'$$

When a plane is rotated about the first sensor 111 having a measurement axis parallel to the x axis, only the x' coordinate value of the plane after rotation is changed from the x coordinate value of the valid measurement point of the first sensor 111. Meanwhile, the y' and z' coordinate values of the plane after rotation will remain unchanged from the y and z coordinate values of the valid measurement point of the first sensor 111. That is, the y' coordinate value of the rotated plane is X1b (y'=X1b) and the z' coordinate value of the rotated plane is X1c (z'=X1c).

The above-noted generalizations may be extended to rotations about each of the three axes of rotation, i.e., the x, y, and z axes of rotation.

First, it will be assumed that rotations are performed according to an order, such as z axis rotations, then y axis rotations, and then x axis rotations. It is contemplated, however, that other "orders" may be utilized. Rotations, however, may be made in six different orders (or sequences). One order of rotations may be arbitrarily determined in sensor kinematics and the determined order may be equally applied in actuator kinematics. Therefore, it is noted that the specification of one order of rotations versus another order of rotations does not lose generality.

Accordingly, when a plane is rotated in the order of rotations described above, surface coefficients before rotation and surface coefficients after rotation may satisfy the following relationship:

*[p'q'r's']=[pqrs]×Rz⁻¹×Ry⁻¹×Rx⁻¹*

Thus, the following matrices may be obtained before and after rotation.

$$pqrs = \begin{bmatrix} 1 & 0 & 0 & -X1a \\ 1 & 0 & 0 & -X2a \\ 0 & 1 & 0 & -Yb \\ 0 & 0 & 1 & -Z4c \\ 0 & 0 & 1 & -Z5c \\ 0 & 0 & 1 & -Z6c \end{bmatrix},$$

$$SC = \begin{bmatrix} 0 & 0 & Ya & Z4a & Z5a & Z6a \\ X1b & X2b & 0 & Z4b & Z5b & Z6b \\ X1c & X2c & Yc & 0 & 0 & 0 \\ 1 & 1 & 1 & 1 & 1 & 1 \end{bmatrix}$$

Matrix pqrs represents surface coefficients (before rotation) of the measurement surfaces of the sensors 111-116, and the matrix SC represents coordinate values that are not changed during rotation.

For example, since the equation of the measurement surface of the first sensor 111 is x=X1a, and a planar equation representing this is x−X1a=0, the surface coefficients of the measurement surface of the first sensor 111 is 100−X1a. The surface coefficients of the measurement surface of the first sensor 111 are arranged in the first row of the matrix pqrs. In the same manner, the surface coefficients of the measurement surface of the second sensor 112 are arranged in the second row of the matrix pqrs, the surface coefficients of the measurement surface of the third sensor 113 are arranged in the third row of the matrix pqrs, the surface coefficients of the measurement surface of the fourth sensor 114 are arranged in the fourth row of the matrix pqrs, the surface coefficients of the measurement surface of the fifth sensor 115 are arranged in the fifth row of the matrix pqrs, and the surface coefficients of the measurement surface of the sixth sensor 116 are arranged in the sixth row of the matrix pqrs.

When a plane is rotated about the first sensor 111 having a measurement axis parallel to the x axis, the y' coordinate value of the plane after rotation is X1b (y'=X1b) and the z' coordinate value of the plane after rotation is X1c (z'=X1c). Accordingly, the coordinate values that are not changed through rotation are 0, X1b, X1c, and 1. The coordinate values that are not changed through rotation about the first sensor 111 are arranged in the first row of the matrix SC. In the same manner, the coordinate values that are not changed through rotation about the second sensor 112 are arranged in the second row of the matrix SC, the coordinate values that are not changed through rotation about the third sensor 113 are arranged in the third row of the matrix SC, the coordinate values that are not changed through rotation about the fourth sensor 114 are arranged in the fourth row of the matrix SC, the coordinate values that are not changed through rotation about the fifth sensor 115 are arranged in the fifth row of the matrix SC, and the coordinate values that are not changed through rotation about the sixth sensor 116 are arranged in the sixth row of the matrix SC.

When $t = -1 pqrs \times Rz^{-1} \times Ry^{-1} \times Rx^{-1} \times SC$, the following six equations may be obtained using the measurement displacement information acquired from the sensors 111-116, and expressions representing the amount of change of the position and attitude at each measurement axis:

Measurement Information of Sensor 1=−X1a+t(1,1)/pqrs(1,1)

Measurement Information of Sensor 2=−X2a+t(2,2)/pqrs(2,1)

Measurement Information of Sensor 3=−Yb+t(3,3)/pqrs(3,2)

Measurement Information of Sensor 4=−Z4c+t(4,4)/pqrs(4,3)

Measurement Information of Sensor 5=−Z5c+t(5,5)/pqrs(5,3)

Measurement Information of Sensor 6=−Z6c+t(6,6)/pqrs(6,3)

The above six equations may be sorted, simplified, and expressed as shown in Table 1.

TABLE 1

| | | | |
|---|---|---|---|
| sensor1 = | X | Y*tan(Tz)*cos(Tx)/cos(Ty)+Y*tan(Ty)*sin(Tx) | Z*tan(Tz)*sin(Tx)/cos(Ty)−Z*tan(Ty)*cos(Tx) |
| | −X1a+X1a/cos(Tz)/cos(Ty) | −X1b*tan(Tz)*cos(Tx)/cos(Ty)−X1b*tan(Ty)*sin(Tx) | −X1c*tan(Tz)*sin(Tx)/cos(Ty)+X1c*tan(Ty)*cos(Tx) |
| sensor2 = | X | Y*tan(Tz)*cos(Tx)/cos(Ty)+Y*tan(Ty)*sin(Tx) | Z*tan(Tz)*sin(Tx)/cos(Ty)−Z*tan(Ty)*cos(Tx) |
| | −X2a+X2a/cos(Tz)/cos(Ty) | −X2b*tan(Tz)*cos(Tx)/cos(Ty)+X2b*tan(Ty)*sin(Tx) | −X2c*tan(Tz)*sin(Tx)/cos(Ty)+X2c*tan(Ty)*cos(Tx) |
| sensor3 = | −X*sin(Tz)*cos(Ty)/(cos(Tz)*cos(Tx)−sin(Tz)*sin(Ty)*sin(Tx)) | Y | Z*(cos(Tz)*sin(Tx)+sin(Tz)*sin(Ty)*cos(Tx))/(cos(Tz)*cos(Tx)−sin(Tz)*sin(Ty)*sin(Tx)) |
| | Ya*sin(Tz)*cos(Ty)/(cos(Tz)*cos(Tx)−sin(Tz)*sin(Ty)*sin(Tx)) | −Yb+Yb/(cos(Tz)*cos(Tx)−sin(Tz)*sin(Ty)*sin(Tx)) | −Yc*(cos(Tz)*sin(Tx)+sin(Tz)*sin(Ty)*cos(Tx))/(cos(Tz)*cos(Tx)−sin(Tz)*sin(Ty)*sin(Tx)) |
| sensor4 = | X*tan(Ty)/cos(Tx) | −Y*tan(Tx) | Z |
| | −Z4a*tan(Ty)/cos(Tx) | Z4b*tan(Tx) | −Z4c+Z4c/cos(Ty)/cos(Tx) |
| sensor5 = | X*tan(Ty)/cos(Tx) | −Y*tan(Tx) | Z |
| | −Z5a*tan(Ty)/cos(Tx) | Z5b*tan(Tx) | −Z5c+Z5c/cos(Ty)/cos(Tx) |
| sensor6 = | X*tan(Ty)/cos(Tx) | −Y*tan(Tx) | Z |
| | −Z6a*tan(Ty)/cos(Tx) | Z6b*tan(Tx) | −Z6c+Z6c/cos(Ty)/cos(Tx) |

According to various exemplary embodiments, the position and attitude information (X, Y, Z, Tx, Ty, Tz) of the stage 140 may be determined by solving the equations of Table 1.

According to one embodiment, an overall order of calculation of the position and attitude information (X, Y, Z, Tx, Ty, Tz) of the stage 140 is as follows:

Process 1: The rotation angle Tx in the roll direction and the rotation angle Ty in the pitch direction are determined based on (Equation of Sensor 4–Equation of Sensor 5) and (Equation of Sensor 4–Equation of Sensor 6), as will become more apparent below.

Process 2: The rotation angle Tz in the yaw direction is determined based on (Equation of Sensor 1–Equation of Sensor 2), as will become more apparent below.

Process 3: The position information (X, Y, Z) is determined based on the Equation of Sensor 1, the Equation of Sensor 3, and the Equation of Sensor 4, as will become more apparent below.

First, in process 1, the following expressions are obtained:

Equation of Sensor 4 – Equation of Sensor 5 =

$$(Z5a - Z4a) * \frac{\tan(Ty)}{\cos(Tx)} + (Z4b - Z5b) * \tan(Tx) +$$
$$(Z4c - Z5c) * \frac{1}{\cos(Ty)\cos(Tx)} + (Z5c - Z4c)$$

Equation of Sensor 4 – Equation of Sensor 6 = $(Z6a - Z4a) * \frac{\tan(Ty)}{\cos(Tx)} +$
$$(Z4b - Z6b) * \tan(Tx) + (Z4c - Z6c) * \frac{1}{\cos(Ty)\cos(Tx)} + (Z6c - Z4c)$$

When Z5a−Z4a=$a_{11}$, Z4b−Z5b=$a_{12}$, Z4c−Z5c=$a_{13}$, Z5c−Z4c+Equation of Sensor 5–Equation of Sensor 4=$a_{14}$, Z6a−Z4a=$a_{21}$, Z4b−Z6b=$a_{22}$, Z4c−Z6c=$a_{23}$, and Z6c−Z4c+Equation of Sensor 6–Equation of Sensor 4=$a_{24}$, the following expressions are obtained:

$$a_{11} * \frac{\tan(Ty)}{\cos(Tx)} + a_{12} * \tan(Tx) + a_{13} * \frac{1}{\cos(Ty)\cos(Tx)} + a_{14} = 0 \quad (1)$$

$$a_{21} * \frac{\tan(Ty)}{\cos(Tx)} + a_{22} * \tan(Tx) + a_{23} * \frac{1}{\cos(Ty)\cos(Tx)} + a_{24} = 0 \quad (2)$$

When $$A = \frac{\tan(Ty)}{\cos(Tx)}, \; B = \tan(Tx), \; C = \frac{1}{\cos(Ty)\cos(Tx)},$$

Expression (3) is obtained from Expression (1), and Expression (4) is obtained from Expression (2).

$$a_{11}*A + a_{12}*B + a_{13}*C + a_{14} = 0 \quad (3)$$

$$a_{21}*A + a_{22}*B + a_{23}*C + a_{24} = 0 \quad (4)$$

The following Expression is satisfied based on the above-noted definitions of A, B, and C:

$$A^2 + 1 + B^2 - C^2 = 0 \quad (5)$$

A proof of Expression (5) is as follows:

$$A^2 + 1 + B^2 - C^2 = \frac{\tan^2(Ty)}{\cos^2(Tx)} + (1 + \tan^2(Tx)) - \sec^2(Ty)\sec^2(Tx)$$
$$= \frac{\tan^2(Ty)}{\cos^2(Tx)} + \sec^2(Tx) - \sec^2(Ty)\sec^2(Tx)$$
$$= \frac{\tan^2(Ty)}{\cos^2(Tx)} + \sec^2(Tx)(1 - \sec^2(Ty))$$
$$= \frac{\tan^2(Ty)}{\cos^2(Tx)} - \sec^2(Tx) - \tan^2(Ty)$$
$$= 0$$

Further, during process 2, Tz may be obtained based on Tx and Ty determined in association with process 1.

As such, $$\text{Equation of Sensor 1 – Equation of Sensor 2} = \quad (9)$$
$$(X2a - X1a) * \left(1 - \frac{1}{\cos(Tz)\cos(Ty)}\right) +$$
$$(X2b - X1b)\left(\tan(Ty)\sin(Tx) + \frac{\tan(Tz)\cos(Tx)}{\cos(Ty)}\right) +$$
$$(X2c - X1c)\left(\frac{\tan(Tz)\sin(Tx)}{\cos(Ty)} - \tan(Ty)\cos(Tx)\right)$$

It is noted that Tz is obtainable because Tx and Ty have already been determined and only Tz remains unknown.

As such, B and C may be determined based on Equations (3) and (4). In this manner, B and C may be defined as:

$$B = \frac{1}{a_{12}a_{23} - a_{13}a_{22}}[(a_{13}a_{21} - a_{11}a_{23})A + (a_{13}a_{24} - a_{14}a_{23})] \quad (6)$$
$$= b_{11}A + b_{12}$$

$$C = \frac{1}{a_{13}a_{22} - a_{12}a_{23}}[(a_{12}a_{21} - a_{11}a_{22})A + (a_{12}a_{24} - a_{14}a_{22})] \quad (7)$$
$$= b_{21}A + b_{22}$$

It is further noted that $b_{11}$, $b_{12}$, $b_{21}$, and $b_{22}$ may be defined, such that:

$$b_{11} = \frac{a_{13}a_{21} - a_{11}a_{23}}{a_{12}a_{23} - a_{13}a_{22}},$$
$$b_{12} = \frac{a_{13}a_{24} - a_{14}a_{23}}{a_{12}a_{23} - a_{13}a_{22}},$$
$$b_{21} = \frac{a_{12}a_{21} - a_{11}a_{22}}{a_{13}a_{22} - a_{12}a_{23}},$$
$$b_{22} = \frac{a_{12}a_{24} - a_{14}a_{22}}{a_{13}a_{22} - a_{12}a_{23}}.$$

Accordingly, the following Expression (8) may be obtained by substituting Equations (6) and (7) into Expression (5).

$$(1 + b_{11}^2 - b_{21}^2)A^2 + 2(b_{11}b_{12} - b_{21}b_{22})A + (b_{12}^2 - b_{22}^2 + 1) = 0 \quad (8)$$

Roots $A_1$ and $A_2$ may be obtained based on Expression (8), such that two sets of roots $(A_1, B_1, C_1)$ and $(A_2, B_2, C_2)$ may be obtained in association with A, B, and C.

Based on these values, it is possible to determine Tx and Ty in association with satisfying $$A = \frac{\tan(Ty)}{\cos(Tx)}, B = \tan(Tx), C = \frac{1}{\cos(Ty)\cos(Tx)}.$$

Accordingly, because Tx, Ty, and Tz have been determined by way of processes 1 and 2, it may only be necessary to determine the remaining values of X, Y, and Z in association with process 3.

As can be appreciated from the definition of the Equation of Sensor 3 and the Equation of Sensor 4, Tx, Ty, and Tz have already been determined via processes 1 and 2, such that X, Y, and Z variables remain unknown. Therefore, the values of X, Y, and Z may be simultaneously determined based on solving simultaneous linear equations associated with three unknown variables, i.e., X, Y, and Z.

Figure 6:
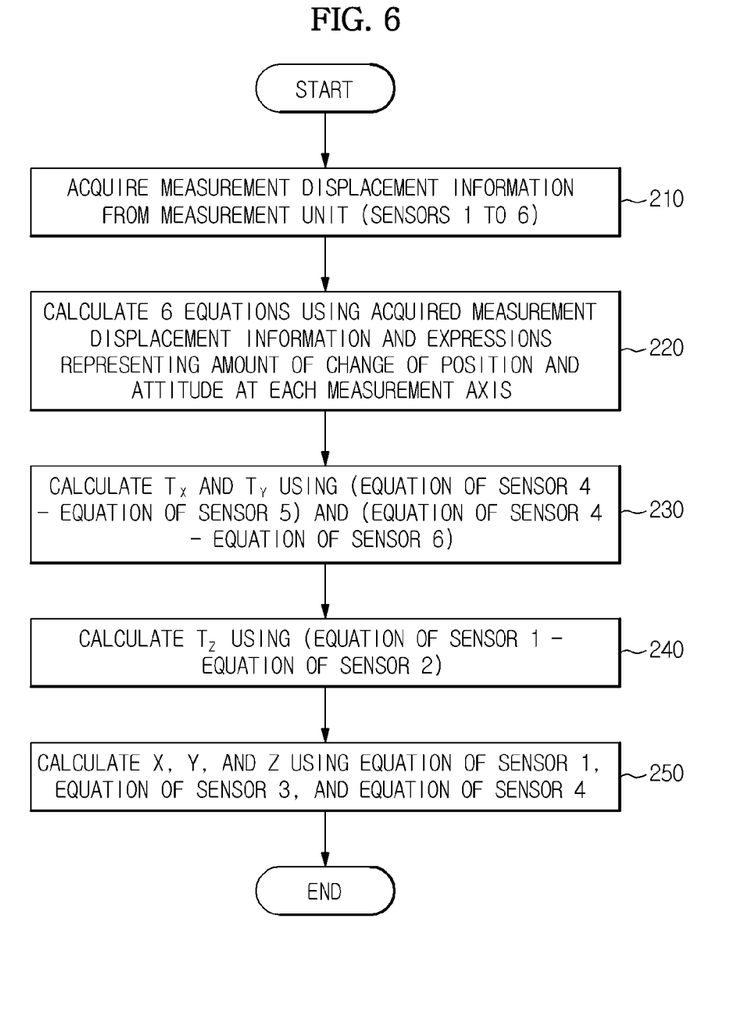
FIG. 6 is a flowchart to determine position and attitude information associated with a 6-degree-of-freedom stage, according to an exemplary embodiment.

FIG. 6 is a flowchart to determine position and attitude information associated with a 6-degree-of-freedom stage, according to an exemplary embodiment.

First, it is assumed that stage 140 is outfit with six sensors 111-116, such that sensors 111 and 112 will have a measurement axis parallel to the x axis, one sensor 113 will have a measurement axis parallel to the y axis, and three sensors 114, 115, and 116 will have a measurement axis parallel to the z axis. It is also assumed that three coordinate values associated with each of the valid measurement points P1 to P6 associated with each of the six sensors 111-116 will be associated with a degree of freedom.

Accordingly, when movement and rotation of the stage 140 starts, the controller 120 will receive measurement displacement information from the measurement unit 110 (210).

Position and attitude information module 122 in the controller 120 determines six equations using measurement displacement information received from the sensors 111-116 (220). In this manner, expressions representing the amount of change of the position and attitude at each measurement axis may be defined (220).

The position and attitude information module 122 will determine the rotation angle Tx in the roll direction and the rotation angle Ty in the pitch direction based on (Equation of Sensor 4−Equation of Sensor 5) and (Equation of Sensor 4−Equation of Sensor 6) (230).

As such, the position and attitude information module 122 will then determine the rotation angle Tz in the yaw direction based on (Equation of Sensor 1−Equation of Sensor 2).

The position and attitude information module 122 will then determine position information (X, Y, Z) based on the Equation of Sensor 1, the Equation of Sensor 3, and the Equation of Sensor 4.

In this manner, the controller 120 may utilize the position and attitude information to control a spatially positioning and/or rotation of the 6-degree-of-freedom stage 140 and/or the ultra-precision position control device 100.

According to various exemplary embodiments, the position and attitude information associated with a 6-degree-of-freedom stage may be more accurately determined because mathematical approximation is not applied to simplify calculation in a procedure of determining position and attitude information associated with the 6-degree-of-freedom stage using kinematics and a procedure of modeling the 6-degrees-of-freedom stage. As such, the 6-degree-of-freedom stage may be more accurately controlled based on position and attitude information.

It will be apparent to those skilled in the art that various modifications and variations can be made without departing from the spirit or scope of the invention. Thus, it is intended that the present invention cover the modifications and variations provided they come within the scope of the appended claims and their equivalents.

What is claimed is:

1. A method, comprising:
receiving, from at least six sensors associated with a 6-degree-of-freedom stage, displacement information associated with movement of the 6-degree-of-freedom stage;
determining, by a control unit and based on the displacement information, a plurality of equations associated with the at least six sensors to represent an amount of change in position and attitude associated with each measurement axis of each of the at least six sensors;
determining, by the control unit, position information (X, Y, Z) and attitude information (Tx, Ty, Tz) associated with the 6-degree-of-freedom stage using the equations; and
causing, at least in part, the movement of the 6-degree-of-freedom stage to be controlled based on the position information (X, Y, Z), the attitude information (Tx, Ty, Tz), or both the position information (X, Y, Z) and the attitude information (Tx, Ty, Tz),
wherein three coordinate values associated with each valid measurement point of each of the at least six sensors are associated with at least one degree of freedom,
wherein the plurality of equations respectively corresponding to the at least six sensors are determined using the following six expressions:

Measurement Information of First Sensor=−X1a+t(1, 1)/pqrs(1,1)  First Expression Measurement Information of Second Sensor=−X2a+t (2,2)/pqrs(2,1)  Second Expression Measurement Information of Third Sensor=−Yb+t(3, 3)/pqrs(3,2)  Third Expression Measurement Information of Fourth Sensor=−Z4c+t (4,4)/pqrs(4,3)  Fourth Expression Measurement Information of Fifth Sensor=−Z5c+t(5, 5)/pqrs(5,3)  Fifth Expression Measurement Information of Sixth Sensor=−Z6c+t(6, 6)/pqrs(6,3),  Sixth Expression wherein:

$$pqrs = \begin{bmatrix} 1 & 0 & 0 & -X1a \\ 1 & 0 & 0 & -X2a \\ 0 & 1 & 0 & -Yb \\ 0 & 0 & 1 & -Z4c \\ 0 & 0 & 1 & -Z5c \\ 0 & 0 & 1 & -Z6c \end{bmatrix},$$

$$SC = \begin{bmatrix} 0 & 0 & Ya & Z4a & Z5a & Z6a \\ X1b & X2b & 0 & Z4b & Z5b & Z6b \\ X1c & X2c & Yc & 0 & 0 & 0 \\ 1 & 1 & 1 & 1 & 1 & 1 \end{bmatrix},$$

-continued $$R_x = \begin{bmatrix} 1 & 0 & 0 & 0 \\ 0 & \cos(T_x) & -\sin(T_x) & 0 \\ 0 & \sin(T_x) & \cos(T_x) & 0 \\ 0 & 0 & 0 & 1 \end{bmatrix}$$

$$R_y = \begin{bmatrix} \cos(T_y) & 0 & \sin(T_y) & 0 \\ 0 & 1 & 0 & 0 \\ -\sin(T_y) & 0 & \cos(T_y) & 0 \\ 0 & 0 & 0 & 1 \end{bmatrix}$$

$$R_z = \begin{bmatrix} \cos(T_z) & -\sin(T_z) & 0 & 0 \\ \sin(T_z) & \cos(T_z) & 0 & 0 \\ 0 & 0 & 1 & 0 \\ 0 & 0 & 0 & 1 \end{bmatrix},$$

$$t = -1pqrs \times Rz^{-1} \times Ry^{-1} \times Rx^{-1} \times SC,$$

and wherein valid measurement points associated with the at least six sensors are P1(X1a, X1b, X1c) for a first sensor of the at least six sensors, P2(X2a, X2b, X2c) for a second sensor of the at least six sensors, P3(Ya, Yb, Yc) for a third sensor of the at least six sensors, P4(Z4a, Z4b, Z4c) for a fourth sensor of the at least six sensors, P5(Z5a, Z5b, Z5c) for a fifth sensor of the at least six sensors, and P6(Z6a, Z6b, Z6c) for a sixth sensor of the at least six sensors.

2. The method according to claim 1, wherein a rotation angle Tx in a roll direction and a rotation angle Ty in a pitch direction of the 6-degree-of-freedom stage are determined using a result of the fourth expression minus the fifth expression and a result of the fourth expression minus the sixth expression.

3. The method according to claim 2, wherein a rotation angle Tz in a yaw direction of the 6-degree-of-freedom stage is determined using a result of the first expression minus the second expression.

4. The method according to claim 3, wherein the position information (X, Y, Z) associated with the 6-degree-of-freedom stage is determined using the first expression, the third expression, and the fourth expression.

5. An ultra-precision position control device, comprising:
a 6-degree-of-freedom stage;
at least six sensors configured to measure displacement information associated with movement of the 6-degree-of-freedom stage;
a controller configured to:
  receive displacement information associated with the 6-degree-of-freedom stage from the at least six sensors,
  determine, based on the displacement information, a plurality of equations associated with the at least six sensors to represent an amount of change in position and attitude associated with each measurement axis of each of the at least six sensors,
  determine position information (X, Y, Z) and attitude information (Tx, Ty, Tz) associated with the 6-degree-of-freedom stage using the equations, and
  generate at least one drive command signal using the position information (X, Y, Z) and the attitude information (Tx, Ty, Tz) associated with the 6-degree-of-freedom stage; and
a drive unit configured to receive the at least one drive command signal and to drive the 6-degree-of-freedom stage in one or more translational or rotational motions based on the at least one drive command signal, wherein three coordinate values associated with each valid measurement point of each of the at least six sensors are associated with at least one degree of freedom, wherein the plurality of equations respectively corresponding to the at least six sensors are determined using the following six expressions:

Measurement Information of First Sensor=−X1a+t(1, 1)/pqrs(1,1)  First Expression Measurement Information of Second Sensor=−X2a+t (2,2)/pqrs(2,1)  Second Expression Measurement Information of Third Sensor=−Yb+t(3, 3)/pqrs(3,2)  Third Expression Measurement Information of Fourth Sensor=−Z4c+t (4,4)/pqrs(4,3)  Fourth Expression Measurement Information of Fifth Sensor=−Z5c+t(5, 5)/pqrs(5,3)  Fifth Expression Measurement Information of Sixth Sensor=−Z6c+t(6, 6)/pqrs(6,3),  Sixth Expression wherein:

$$pqrs = \begin{bmatrix} 1 & 0 & 0 & -X1a \\ 1 & 0 & 0 & -X2a \\ 0 & 1 & 1 & -Yb \\ 0 & 0 & 1 & -Z4c \\ 0 & 0 & 1 & -Z5c \\ 0 & 0 & 1 & -Z6c \end{bmatrix},$$

$$SC = \begin{bmatrix} 0 & 0 & Ya & Z4a & Z5a & Z6a \\ X1b & X2b & 0 & Z4b & Z5b & Z6a \\ X1c & X2c & Yc & 0 & 0 & 0 \\ 1 & 1 & 1 & 1 & 1 & 1 \end{bmatrix},$$

$$R_x = \begin{bmatrix} 1 & 0 & 0 & 0 \\ 0 & \cos(T_x) & -\sin(T_x) & 0 \\ 0 & \sin(T_x) & \cos(T_x) & 0 \\ 0 & 0 & 0 & 1 \end{bmatrix}$$

$$R_y = \begin{bmatrix} \cos(T_y) & 0 & \sin(T_y) & 0 \\ 0 & 1 & 0 & 0 \\ -\sin(T_y) & 0 & \cos(T_y) & 0 \\ 0 & 0 & 0 & 1 \end{bmatrix}$$

$$R_z = \begin{bmatrix} \cos(T_z) & -\sin(T_z) & 0 & 0 \\ \sin(T_z) & \cos(T_z) & 0 & 0 \\ 0 & 0 & 1 & 0 \\ 0 & 0 & 0 & 1 \end{bmatrix},$$

$$t = -1pqrs \times Rz^{-1} \times Ry^{-1} \times Rx^{-1} \times SC,$$

and wherein valid measurement points associated with the at least six sensors are P1(X1a, X1b, X1c) for a first sensor of the at least six sensors, P2(X2a, X2b, X2c) for a second sensor of the at least six sensors, P3(Ya, Yb, Yc) for a third sensor of the at least six sensors, P4(Z4a, Z4b, Z4c) for a fourth sensor of the at least six sensors, P5(Z5a, Z5b, Z5c) for a fifth sensor of the at least six sensors, and P6(Z6a, Z6b, Z6c) for a sixth sensor of the at least six sensors.

6. The ultra-precision position control device according to claim 5, wherein each of the at least six sensors comprises a laser interferometer.

7. The ultra-precision position control device according to claim 5, wherein the controller is further configured to determine a rotation angle Tx in a roll direction and a rotation angle Ty in a pitch direction of the 6-degree-of-freedom stage using a result of the fourth expression minus the fifth expression and a result of the fourth expression minus the sixth expression.

8. The ultra-precision position control device according to claim 7, wherein the controller is further configured to determine a rotation angle Tz in a yaw direction of the 6-degree-of-freedom stage using a result of the first expression minus the second expression.

9. The ultra-precision position control device according to claim 8, wherein the controller is further configured to determine position information (X, Y, Z) associated with the 6-degree-of-freedom stage using the first expression, the third expression, and the fourth expression.

10. The ultra-precision position control device according to claim 5, wherein the drive unit comprises at least one piezoelectric actuator.

11. The ultra-precision position control device according to claim 5, wherein each of the plurality of sensors comprises a gap sensor.

* * * * *